United States Patent [19]

Shipe

[11] Patent Number: 5,009,608
[45] Date of Patent: Apr. 23, 1991

[54] SEPARABLE CONNECTOR ASSEMBLY FOR AN IC CHIP CARRIER

[75] Inventor: Joanne E. Shipe, Harrisburg, Pa.
[73] Assignee: AMP Incorporated, Harrisburg, Pa.
[21] Appl. No.: 553,217
[22] Filed: Jul. 12, 1990
[51] Int. Cl.5 .................. H01R 13/62; H01R 9/09; H05K 1/00
[52] U.S. Cl. .................. 439/331; 439/73; 439/525
[58] Field of Search .................. 439/66, 71, 72, 73, 439/331, 525, 526, 330

[56] References Cited

U.S. PATENT DOCUMENTS

| | | | |
|---|---|---|---|
| 3,725,424 | 4/1973 | Feldberg | 439/330 |
| 4,505,529 | 3/1985 | Barkus | 439/66 X |
| 4,515,425 | 5/1985 | Nakano | 339/75 MP |
| 4,601,525 | 7/1986 | Kandybowski | 439/331 X |
| 4,616,895 | 10/1986 | Yoshizaki et al. | 439/330 |
| 4,692,790 | 9/1987 | Oyamata | 439/71 |
| 4,758,176 | 7/1988 | Abe et al. | 439/72 X |

Primary Examiner—David L. Pirlot
Assistant Examiner—Julie R. Daulton

[57] ABSTRACT

A connector assembly particularly adapted for burn-in/testing of IC chips (10) held in a TAB film carrier (16, 18) includes a frame (32) mounted on a printed circuit board (26), a lid (44) pivoted to the frame (32), and a handle (54) pivoted to the lid (44). The frame (32) holds a connector housing assembly (40) which has contact members (42) engaged with contact pads (28) on the printed circuit board (26). The carrier (16, 18) is placed in the frame (32) where it is releasably retained so that contact pads (14) on the film (12) engage the contact members (42) of the contact housing assembly (40). Then handle (54) is utilized to provide a mechanical advantage so that the lid (44) generates appropriate contact forces to ensure electrical connections between the contact pads (14) on the film (12) and the contact pads (28) on the printed circuit board 26), and the handle (54) includes a latch mechanism (58, 62) for locking the lid (44) to the frame (32). Withing the frame (32), there is structure (70, 72) for ejecting the carrier (16, 18) after the lid (44) is moved to its open position.

13 Claims, 6 Drawing Sheets

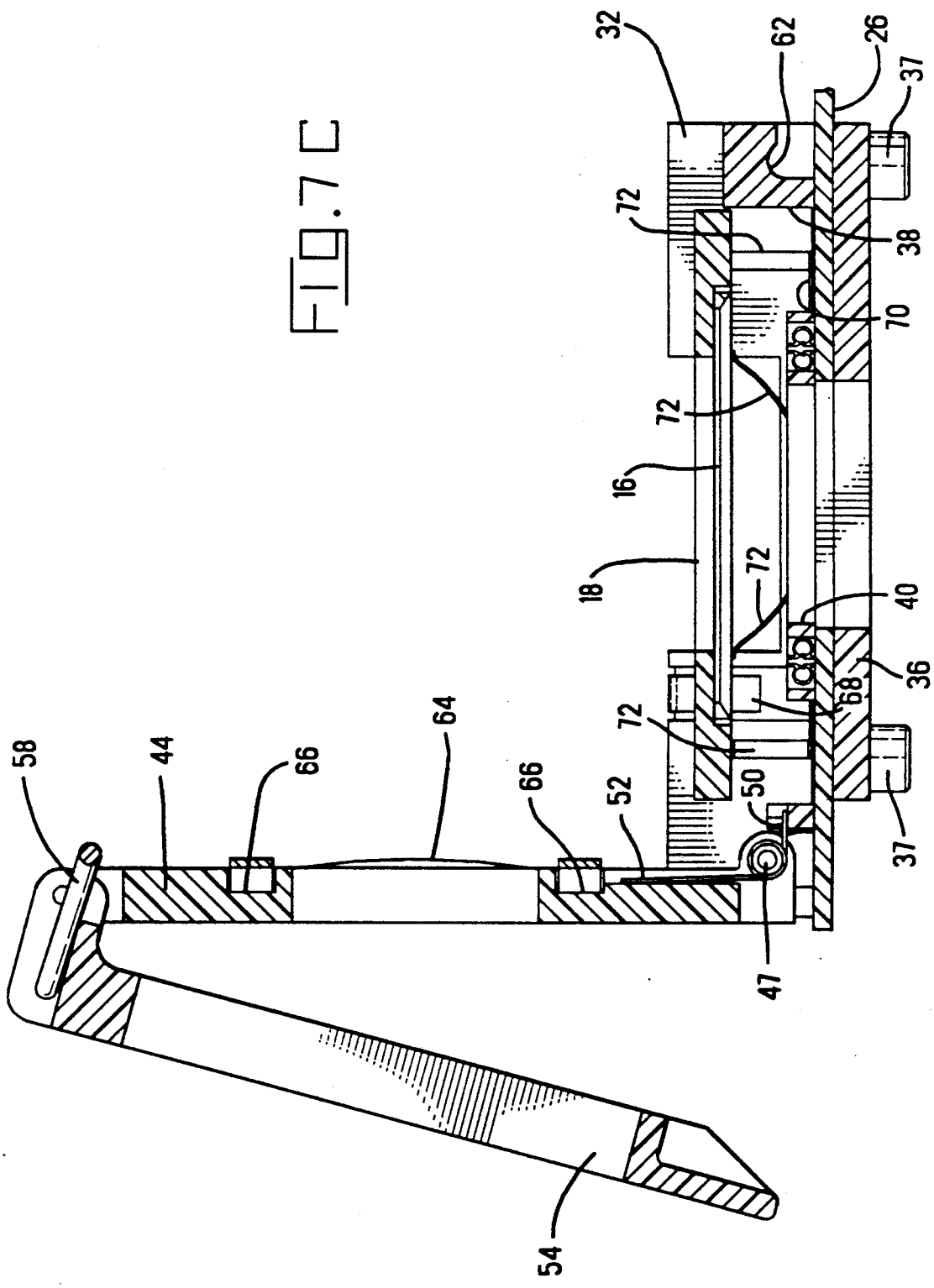

SEPARABLE CONNECTOR ASSEMBLY FOR AN IC CHIP CARRIER

BACKGROUND OF THE INVENTION

This invention relates to connector assemblies for IC chip carriers and, more particularly, to such an assembly which is particularly adapted to use for burn-in and/or testing of IC chips held in a TAB film carrier.

An integrated circuit chip is commonly mounted on a film, or tape, with its input/output pads connected to contact pads on the surface of the tape by a tape automated bonding (TAB) method. When the chip is assembled as part of a larger electronic system, connections are then made to the contact pads on the surface of the tape. However, prior to the chip being shipped by the manufacturer or installed as part of a system, it is typically subjected to burn-in and/or testing. Such burn-in and/or testing involves making a temporary, or separable, connection between the chip and a printed circuit board which forms part of the burn-in/testing apparatus. It is therefore an object of the present invention to provide a connector assembly for separably connecting a tape mounted IC chip to a printed circuit board.

For handling purposes during burn-in/testing, it is conventional to hold the tape containing the IC chip in a rigid carrier. It is therefore a further object of this invention to provide a connector assembly of the type described above which accepts the carrier while making connections to the contact pads on the tape.

For an IC chip mounted on a tape, there may be on the order of 300 or more contact pads to which connections must be made. Each of these connections requires a certain minimal contact force. Therefore, for 300 or more connections, the total contact force required may be on the order of 85 or more pounds. It is therefore another object of this invention to provide a connector assembly of the type described above which allows appropriate contact forces to be generated without requiring undo exertion on the part of an operator.

SUMMARY OF THE INVENTION

The foregoing, and additional, objects are attained in accordance with the principles of this invention by providing a frame mounted on the printed circuit board, the frame having a central opening which exposes the contact pads on the printed circuit board. A connector housing assembly is supported on the printed circuit board in the central opening of the frame, the connector housing assembly including a plurality of contact members each having a first contact portion in contact with the printed circuit board contact pads and a second contact portion exposed through an upper planar surface of the connector housing assembly. A lid member is hingedly mounted to the frame for movement between an open position and a closed position. The carrier holding the tape on which is mounted the IC chip is supported within the central opening of the frame above the connector housing assembly with the tape contact pads being in contact with respective ones of the exposed second contact portions of the contact members in the connector housing assembly. When the lid member is in its closed position, the inventive structure is so arranged that a force is applied to the tape sufficient to establish electrical contact between the contact pads on the tape and the contact pads on the printed circuit board through the contact members.

In accordance with an aspect of this invention, the frame includes structure for releasably retaining the tape carrier in position while the lid member is in its open position, this structure cooperating with the lid member to become ineffective when the lid member is moved to its closed position and thereafter remain ineffective until after the lid member is again moved to its open position and the tape carrier is removed from the central opening of the frame. There is further provided structure for assisting in the ejection of the tape carrier from the central opening of the frame as the lid is moved to its open position.

BRIEF DESCRIPTION OF THE DRAWINGS

The foregoing will be more readily apparent upon reading the following description in conjunction with the drawings in which like elements in different figures thereof have the same reference numeral and wherein:

FIGS. 7A-7C are sectional views taken along the line 7—7 in FIG. 3 showing the connector assembly in its closed position, with the handle released, and with the lid open, respectively.

DETAILED DESCRIPTION

Figure 1:
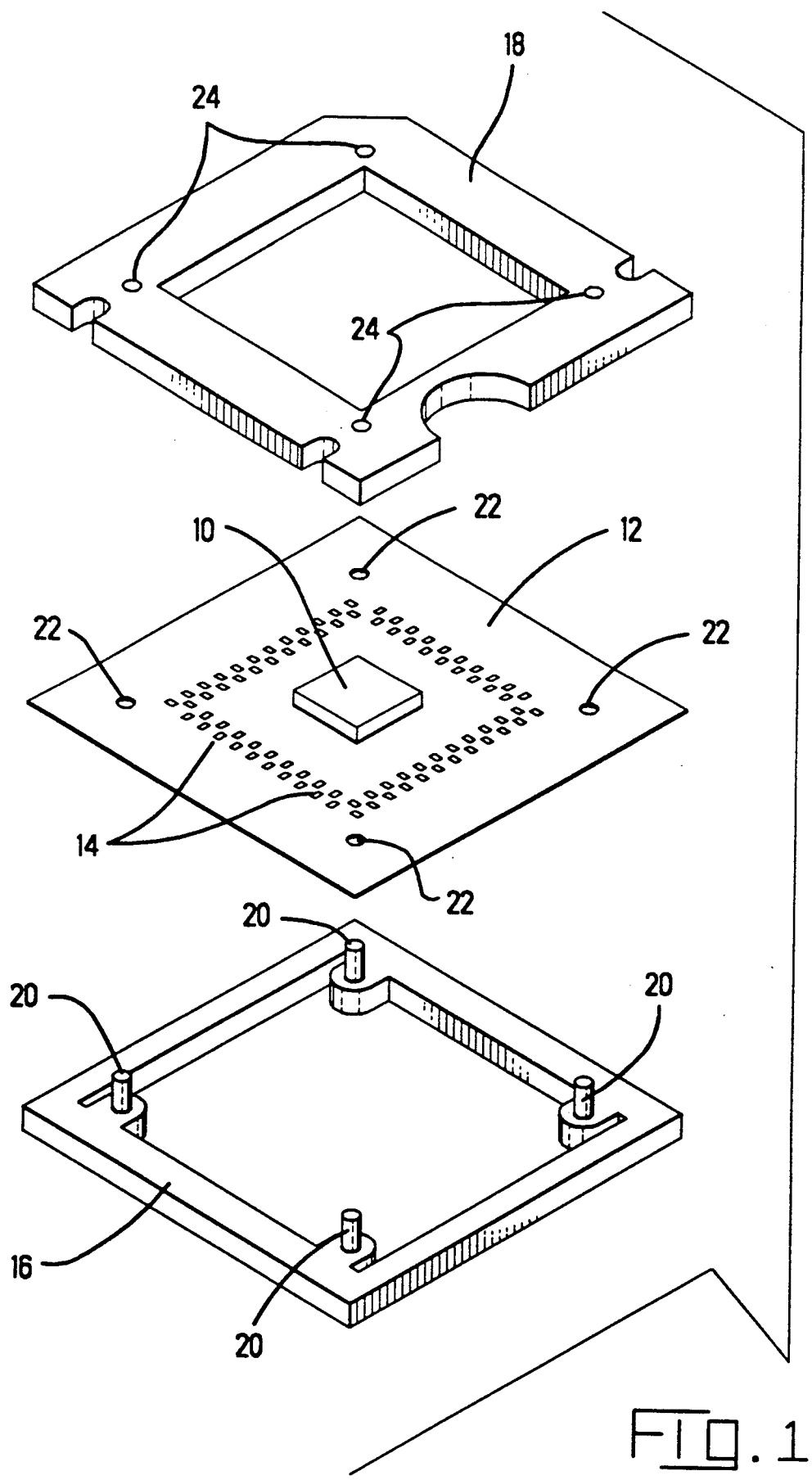
FIG. 1 is an exploded perspective view showing an IC chip mounted on a tape and a snap together two-part tape carrier with which this invention finds utility.

Referring to the drawings, FIG. 1 illustrates an IC chip 10 mounted on a piece of tape 12 which has contact pads 14 at predetermined spaced locations near its periphery. A conventional tape automated bonding (TAB) process is utilized to mount the chip 10 to the tape 12 and at the same time connect the input/output pads of the chip 10 to appropriate ones of the contact pads 14 on the tape 12. For ease in handling, the tape 12 is held in a rigid carrier made up of the two parts 16 and 18. The carrier part 16 is an open four sided frame having spaced molded posts 20. The tape 12 has spaced holes 22 which are complemental to the spacing and size of the posts 20 so that the tape 12 may be installed on the carrier part 16 by inserting the posts 20 through the holes 22. For such installation, the side of the tape 12 containing the chip 10 and the contact pads 14 is placed face down when the tape 12 is installed on the carrier part 16.

The carrier part 18 is larger and thicker than the carrier part 16 and is, like the carrier part 16, an open frame. The carrier part 16 is formed with spaced holes 24 around its central opening which are sized and spaced so that the posts 20 of the carrier part 16 may be inserted therein in a press-fit or snap-fit manner. The underside of the carrier part 18 is rabbeted around its central opening so that when the carrier part 16 is mounted on the carrier part 18 via the posts 20 being inserted through the holes 24, with the tape 12 sandwiched between the parts 16, 18, the entire carrier assembly is a generally flat package. It is this package, which is of standardized construction in the industry, which is accommodated by the structure according to this invention.

Figure 2:
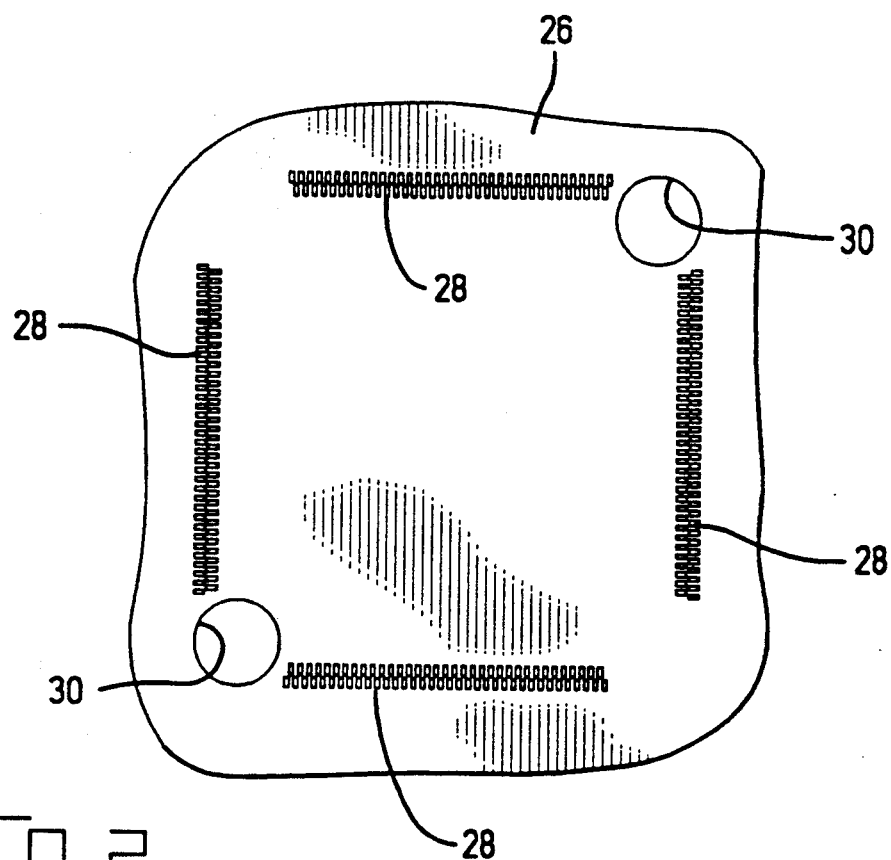
FIG. 2 is a plan view showing an illustrative array of contact pads on a printed circuit board to which the contact pads on the tape of FIG. 1 are to be connected by the structure of this invention.
Figure 3:
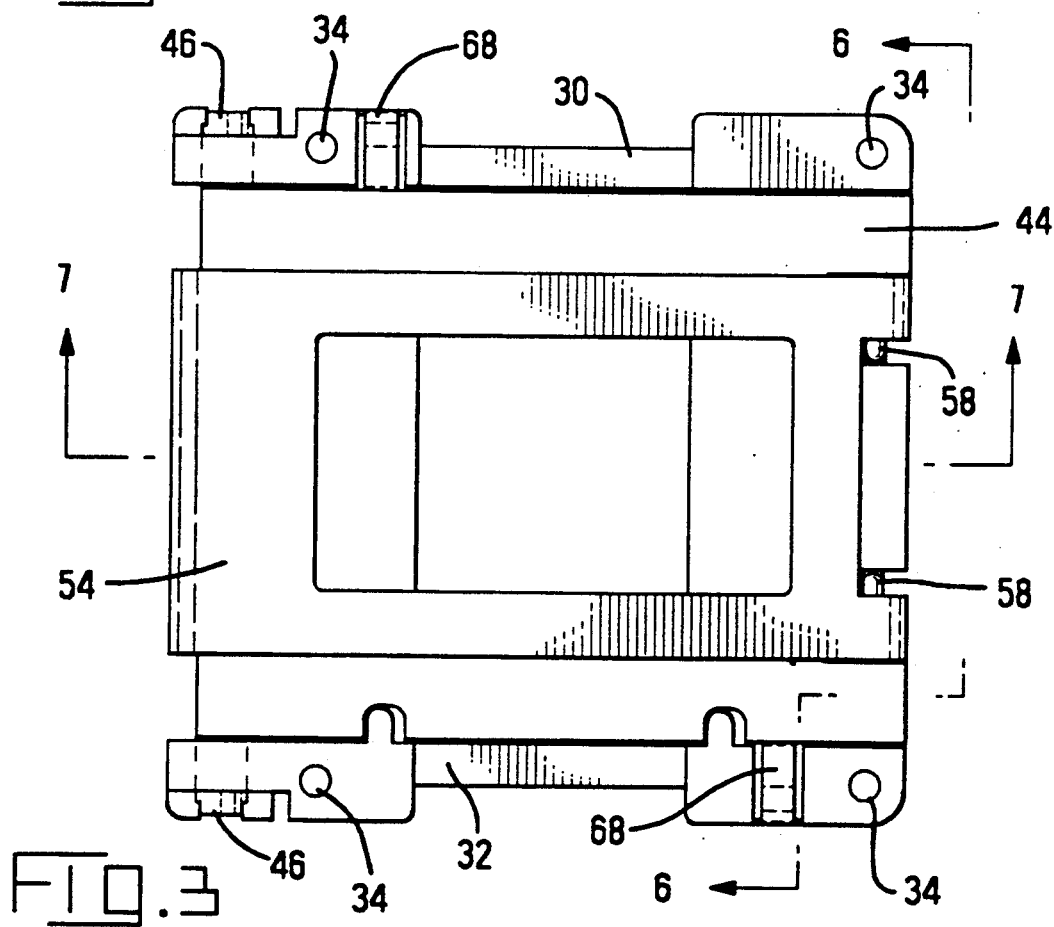
FIG. 3 is a top plan view of a connector assembly constructed in accordance with the principles of this invention, mounted on a printed circuit board.

FIG. 2 illustrates a portion of a printed circuit board 26 on which there has been deposited an array of contact pads 28 at predetermined spaced locations. The contact pads 28 correspond, on a one-to-one basis, to the contact pads 14 on the tape 12. The assembly according to this invention provides a separable connection between the contact pads 14 and the contact pads 28 through a connector housing assembly which may be of the type disclosed in U.S. Pat. No. 4,699,593. The printed circuit board 26 has holes 30 adapted to receive therethrough mounting posts of the connector housing assembly which serve to locate and secure the connector housing assembly to the printed circuit board 26 with the contact members of the connector housing assembly each in electrical contact with a respective one of the contact pads 28.

The connector assembly according to this invention includes a frame 32 having openings 34 for accepting selfthreading screws in order to mount the assembly on the printed circuit board 26. Preferably, a board stiffener 36 is installed on the other side of the printed circuit board 26 from the frame 32. The printed circuit board 26 and the board stiffener 36 have through-holes and the self-threading screws 37 are inserted into the through-holes from the underside of the stiffener 36 and then are turned to form threads in the openings 34 to secure the assembly.

The frame 32 has a central opening 38 which exposes the contact pads 28 on the printed circuit board 26 when the frame 32 is installed. This central opening 38 also contains therein a connector housing assembly 40 mounted on the printed circuit board 26, the connector housing assembly 40 illustratively being of the type disclosed in the aforereferenced patent. Within the connector housing assembly 40, there are a plurality of contact members 42, best shown in FIGS. 7A-7C. The contact members 42 are supported in an array conforming to the array of contact pads 28 on the printed circuit board 26, and each of the contact members 42 includes a first contact portion extending outwardly through the lower surface of the connector housing assembly 40 so that it is in contact with a respective one of the contact pads 28. Each of the contact members 42 also has a second contact portion which extends through the upper surface of the connector housing assembly 40, which upper surface is generally planar. These second contact portions are for the purpose of contacting respective ones of the contact pads 14 on the tape 12, to thereby provide electrical connections between the contact pads 14 and the contact pads 28.

Figure 4:
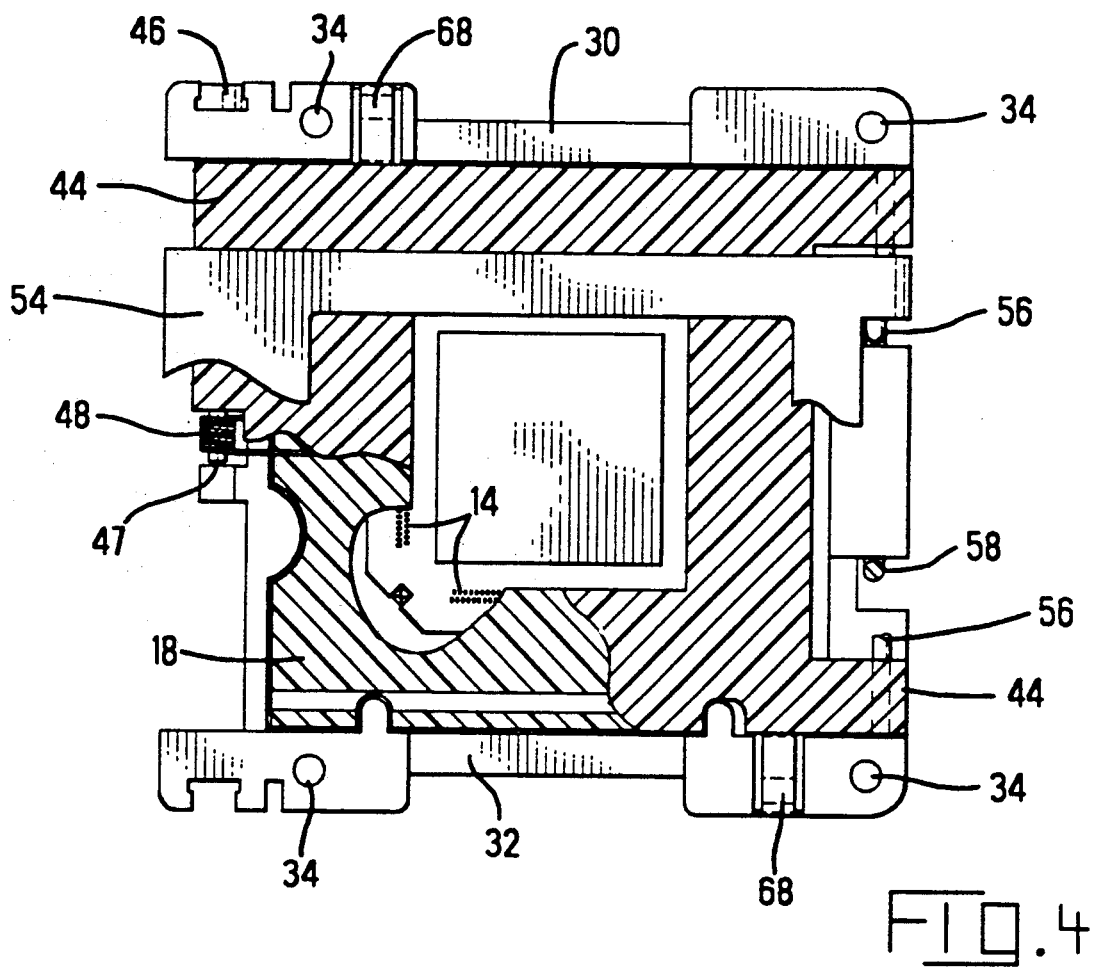
FIG. 4 is a top plan view similar to FIG. 2 but partially sectioned to illustrate various layers of the connector assembly.
Figure 5:
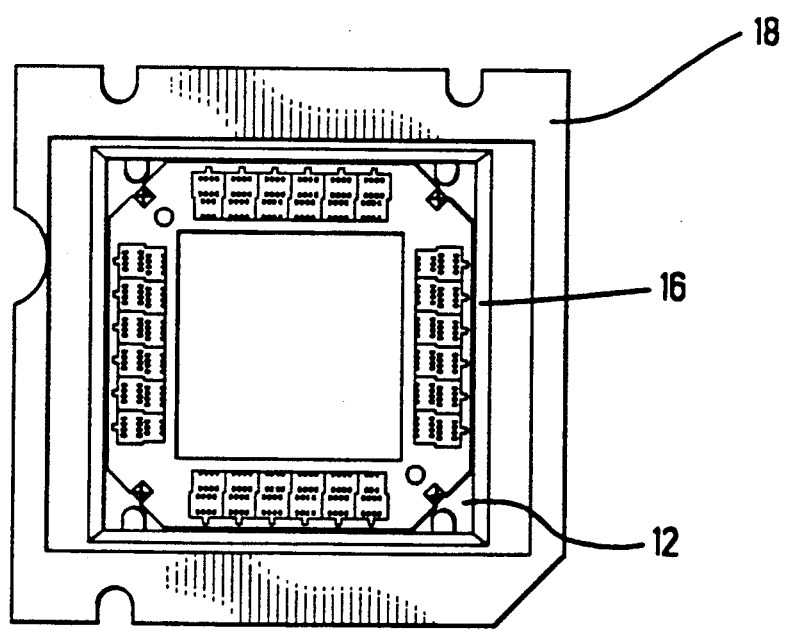
FIG. 5 is a bottom plan view from the printed circuit board showing the connector housing assembly and tape carrier when installed in the assembly of FIGS. 3 and 4.

Also included as part of the connector assembly according to this invention is a lid 44 which is hingedly mounted to the frame 32 by means of a pair of coaxial hinge pins 46 molded as part of the lid 44. For assembly, the pins 46 are snap-fit into suitable bearing surfaces of the frame 32. Also formed as part of the lid 44 is a pin 47, which is coaxial with the pins 46 and of smaller diameter with respect thereto. The pin 47 is centrally located between the pins 46, as is best shown in FIG. 4. Around the pin 47 there is provided a torsion spring 48 having a tang 50 bearing against the frame 32 and a tang 2 bearing against the lid 44. The torsion spring 48 thus functions to bias the lid 44 away from the frame 32 into an open position.

The inventive structure also includes a handle 54 which is hingedly mounted to the lid 44 at the end of the lid 44 opposite the end at which the lid 44 is hingedly mounted to the frame 32. This hinged mounting of the handle 54 to the lid 44 is by means of a pair of hinge pins 56.

Figure 7A:
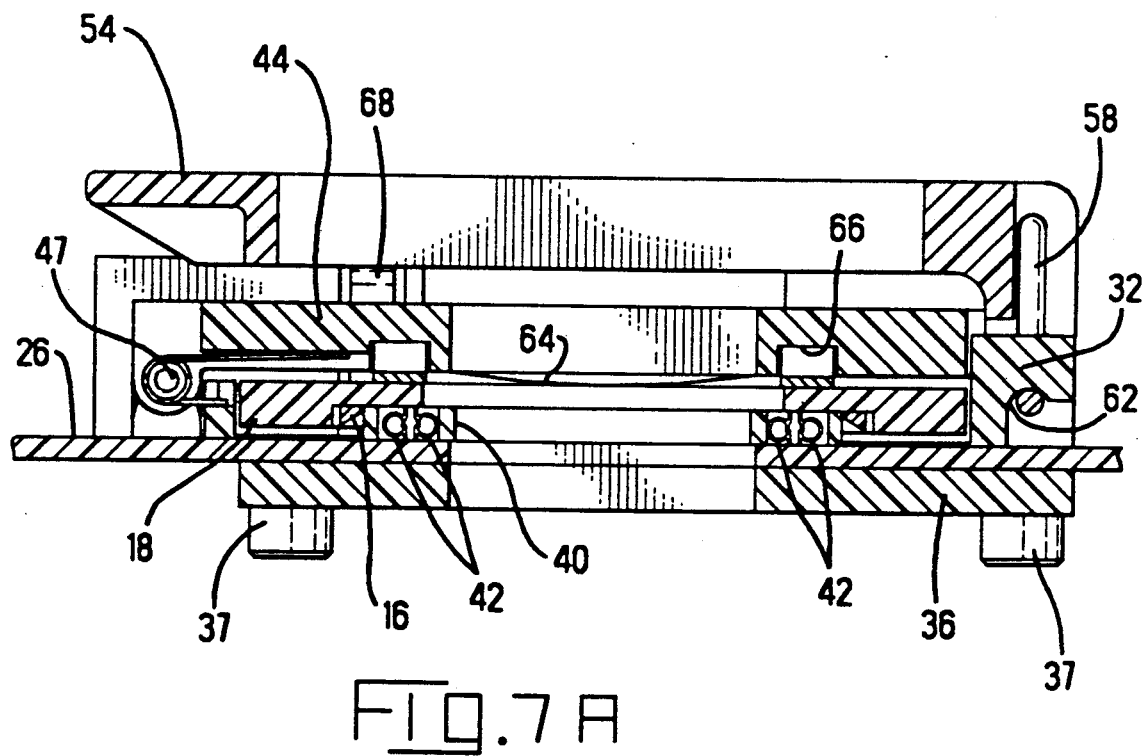

To lock the assembly in its closed position, a wire latch 58 is pivotably mounted to the handle 54 in the general vicinity of the hinged mounting of the handle 54 to the lid 44. Thus, the wire latch 58 is generally U-shaped, having its extremities 60 bent outwardly to extend into through-holes 61 formed in the handle 54. To cooperate with the wire latch 58, the frame 32 is formed with an undercut 62 which acts as a hook to hold the wire latch 58 and retain the lid 44 in its closed position when the handle 54 is moved parallel to the lid 44, as shown in FIG. 7A. To assist in this retention, the pivot point of the handle 54 to the lid 44 relative the pivot point of the wire latch 58 to the handle 54 results in the wire latch 58 being drawn "over center" when the handle 54 is moved to the position shown in FIG. 7A, thereby creating a self-locking mechanism.

To assist in applying an appropriate contact force so as to ensure good electrical connections between the contact pads 14 and the contact pads 28 through the contact members 42, there is provided a spring 64 held on the underside of the lid 44. The spring 64 is generally rectangular in plan view with a central opening and is held within rectangular channels 66 in the lid 44. The spring 64 has bowed portions so that when the lid 44 is in its closed position with the chip carrier in the central opening 38 of the frame 32, the bowed portions of the spring 64 apply downward pressure to the carrier to generate the appropriate contact force.

Figure 6:
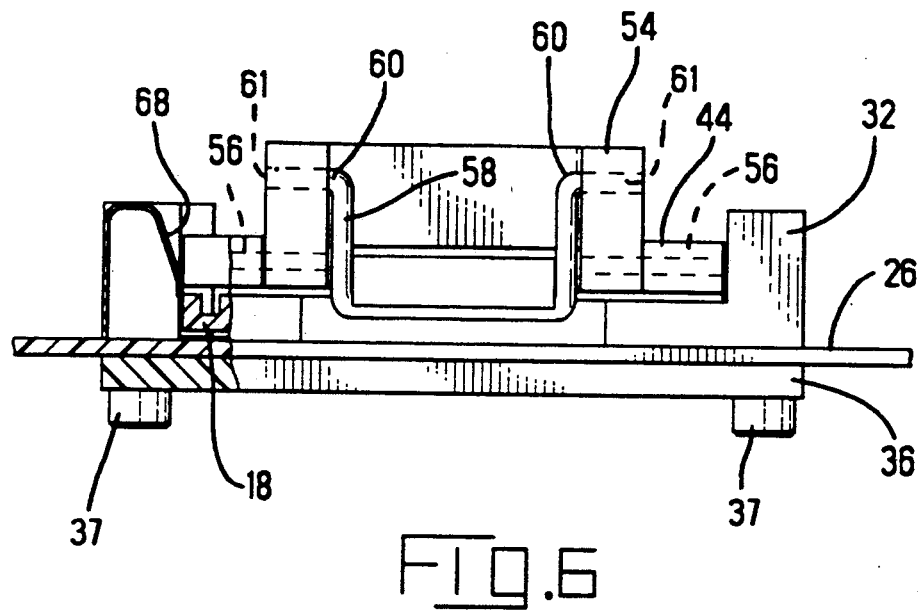
FIG. 6 is a partially sectioned side view of the connector assembly of FIG. 3.

A desireable design feature in a connector assembly of the type described would be to allow the operator to place the carrier into the frame and initially lock it in place, with a mechanism for ejecting the carrier from the frame after burn-in/testing is accomplished. Accordingly, the frame 32 is formed with a pair of retainer spring fingers 68, preferably integrally molded as part of the frame 32, as best shown in FIG. 6. An ejection spring 0 is supported on the printed circuit board 26 surrounding the connector housing assembly 40. The ejection spring 70 has a generally flat open rectangular configuration with upwardly extending fingers 72 about its periphery which engage the underside of the carrier part 18 to bias it upwardly out of the central opening 38 of the frame 32.

Figure 7B:
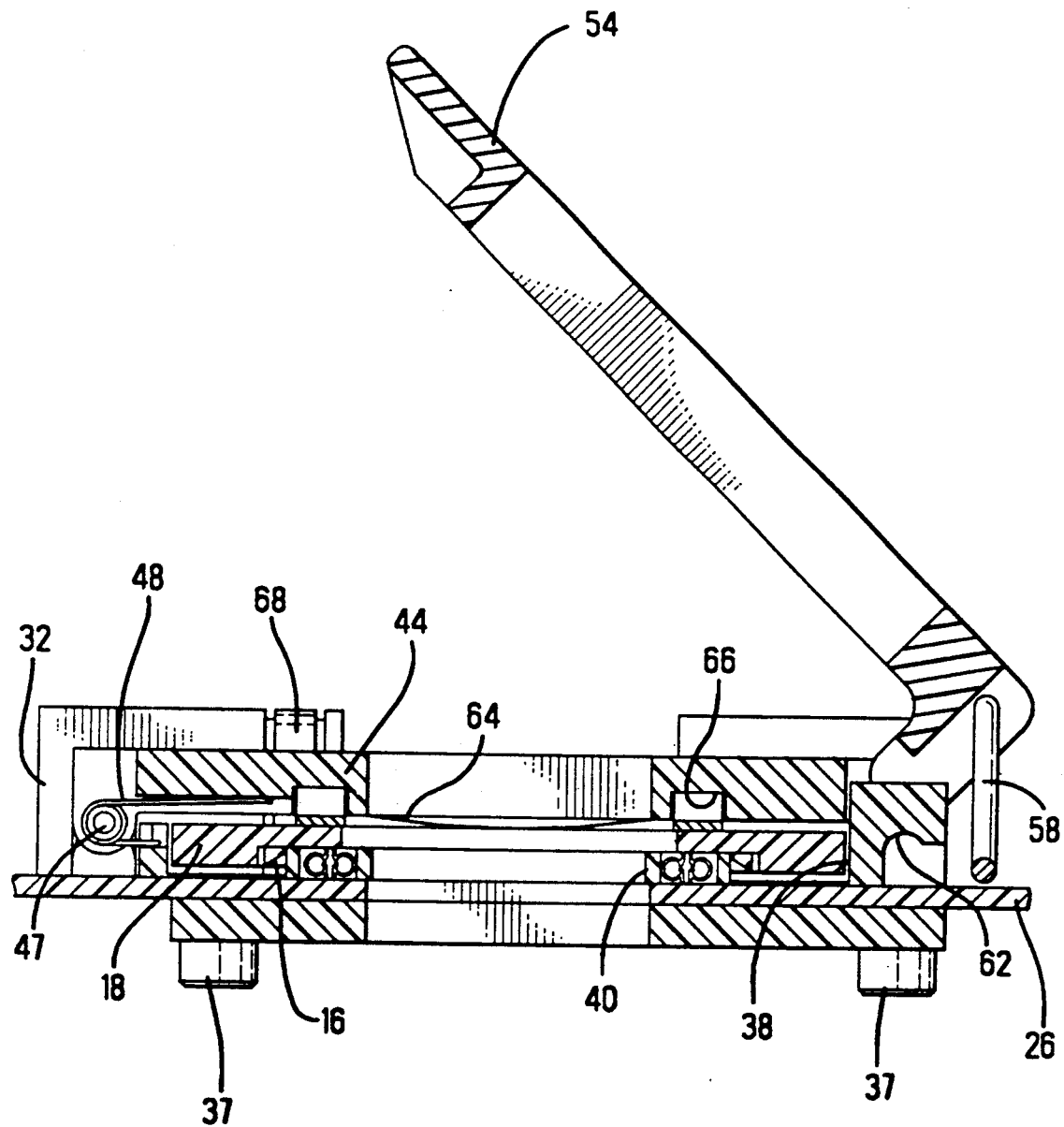

To use the inventive assembly, the operator places the carrier within the central opening 38 of the frame 32 and pushes it downwardly toward the printed circuit board 26 against the upward bias of the ejection spring fingers 72. This action moves the spring fingers 68 outwardly from the central opening 38. As the carrier passes the ends of the retainer spring fingers 68, the fingers 68 will snap over the top of the carrier and retain it in place against the force exerted by the ejection spring fingers 72. The handle 54 is then grasped to pivot the lid 44 until it is parallel to the printed circuit board 26, as shown in FIG. 7B. The wire latch 58 is then placed in the undercut 62 and the handle 54 is pivoted to its closed position (FIG. 7A). The mechanical advantage of the pivoting handle 54 allows a low force on the part of an operator to generate the relatively high total contact force required by the large number of contact members 42. In the position shown in FIG. 7A, the assembly is locked in place and electrical connections are made between the contact pads 14 and the contact pads 28. Burn-in/testing can now be performed.

As the lid 44 is moved from its open position to its closed position, its side walls engage the retainer spring fingers 68 and move them outwardly from the frame central opening 38 so that they no longer interfere with movement of the carrier. However, the lid 44 performs the retaining function previously performed by the fingers 68 and the carrier remains in place. When it is desired to remove the carrier, the handle 54 is moved to its open position (FIG. 7B) and the wire latch 58 is swung away from the undercut 62. As the lid 44 is then pivoted to its open position (FIG. 7C), the side walls of the lid 44 still press against the spring fingers 68 so that they do not interfere with movement of the carrier out of the frame central opening 38 under the influence of the ejection spring fingers 72. Thus, the desireable objective of initially locking the carrier in place and subsequently ejecting the carrier for easy removal has been accomplished.

Accordingly, there has been disclosed an improved connector assembly particularly adapted for burn-in and/or testing of IC chips held in a TAB film carrier. While a preferred embodiment has been disclosed, it will be apparent to those skilled in the art that various modifications to the disclosed embodiment may be made and it is only intended that the scope of this invention be limited by the appended claims.

I claim:

1. A connector assembly for providing separable electrical connections between contact pads (28) on a surface of a first substrate (26) and respective contact pads (14) on a surface of a second substrate (12), comprising:

a frame (32) mounted on said surface of said first substrate (26), said frame (32) including a central opening (38) exposing said first substrate contact pads (28);

a connector housing assembly (40) supported on said first substrate (26) surface in said frame central opening (38), said connector housing assembly (40) including a plurality of contact members (42), each of said plurality of contact members having a first contact portion in contact with a respective one of said first substrate contact pads (28) and a second contact portion exposed through a planar surface of said connector housing assembly (40), said connector housing assembly (40) planar surface being parallel to said first substrate (26) surface and being spaced therefrom;

means (16, 18) for supporting said second substrate in said frame central opening above said connector housing assembly with said second substrate pads (14) in contact with respective ones of said exposed second contact portions of said plurality of contact members;

a lid member (44) hingedly mounted (46) to said frame (32) for movement between a closed position parallel to said first substrate (26) surface and an open position transverse to said first substrate surface;

means (64) mounted on said lid member (44) for applying a force to said second substrate (12) within said frame central opening (38) when said lid member (44) is in said closed position, said force being sufficient to establish electrical contact between said first substrate contact pads (28) and said second substrate contact pads (14) through said contact members (42);

means (58, 62) for locking said lid member (44) in said closed position; and a handle member (54) hingedly mounted to said lid member (44), the hinged mounting (56) of the handle member (54) to the lid member (44) being parallel to and on the opposite end of the lid member (44) from the hinged mounting (46) of the lid member (44) to the frame (32);

said locking means including a hook member (62) on said frame at the end opposite where the lid member (44) is hingedly mounted and a latch member (58) hingedly mounted on said handle member (54) in the general vicinity of the hinged mounting (56) to the lid member (44), the latch member (58) cooperating with the hook member (62) to retain the lid member (44) in said closed position when the handle member (54) is moved to a position parallel relative the lid member (44).

2. The assembly according to claim 1 wherein said hook member (62) comprises an undercut formed on said frame (32), said latch member (58) comprises a generally U-shaped wire member having its extremities (60) bent outwardly and pivotably supported in through-holes (61) in said handle member (54), and wherein the hinged mounting of said handle member (54) to said lid member (44) is so related to the pivoted mounting of said latch member (58) to said handle member (54) that when said latch member (58) is placed in said undercut (62) and said handle member (54) is moved to said parallel position, the latch member (58) is drawn over center to effect a selflocking function.

3. The assembly according to claim 1 further including means (68) for releasably retaining said second substrate (12) within said frame central opening (38) when said lid member (44) is in said open position, said lid member (44) being effective when in said closed position to release said second substrate (12) from said retaining means (68) and thereafter keep said second substrate (12) released as the lid member (44) is moved toward said open position.

4. The assembly according to claim 3 wherein said retaining means includes at least one spring finger (68) extending into the frame central opening (38) and adapted to be moved away from the frame central opening (38) as said second substrate (12) is placed therein and subsequently move back into the frame central opening (38) to interfere with the removal of said second substrate (12).

5. The assembly according to claim 3 further including ejection means (70, 72) mounted in said frame central opening (38) for moving said second substrate (12) out of said frame central opening (38) when said second substrate (12) is released from said retaining means (68) and said lid member (44) is moved toward said open position.

6. The assembly according to claim 5 wherein said ejection means includes spring means (70, 72) mounted in said frame central opening (38) below said second substrate (12) for exerting a force tending to move said second substrate (12) out of said frame central opening (38).

7. In a connector assembly having a frame (32) mounted on a first substrate (26) for providing separable electrical connections between contact pads (28) on a surface of said first substrate (26) and contact pads (14) on a surface of a second substrate (12), an arrangement for releasably retaining said second substrate (12) within a central opening (38) of said frame (32), comprising:

a plurality of spring fingers (68) mounted on said frame (32), each of said spring fingers (68) being self-biased to extend into said frame central opening (38) and adapted to be moved away from said frame central opening (38) as said second substrate (12) is placed therein and subsequently move back into the frame central opening (38) to interfere with the removal of said second substrate (12); and a lid member (44) hingedly mounted to said frame (32) and adapted to be pivoted in and out of said frame central opening (38), said lid member (44) having side walls which engage said spring fingers (68) so as to move said spring fingers (68) away from said frame central opening (38) when said lid member (44) is within said frame central opening;

whereby when said lid member (44) is within said frame central opening (38) said spring fingers (68) no longer interfere with the removal of said second substrate (12) but instead said second substrate (12) is retained in said frame central opening (38) by said lid member (44).

8. The arrangement according to claim 7 further including ejection means (70, 72) mounted in said frame central opening (38) for moving said second substrate (12) out of said frame central opening (38) when said second substrate (12) is released from said spring fingers (68) and said lid member (44) is pivoted out of said frame central opening (38).

9. The arrangement according to claim 8 wherein said ejection means includes spring means (70, 72) mounted in said frame central opening (38) below said second substrate (12) for exerting a force tending to move said second substrate (12) out of said frame central opening (38).

10. A connector assembly for providing separable electrical connections between contact pads (28) on a surface of a first substrate (26) and respective contact pads (14) on a surface of a second substrate (12), comprising:

a frame (32) mounted on said surface of said first substrate (26), said frame (32) including a central opening (38) exposing said first substrate contact pads (28);

a connector housing assembly (40) supported on said first substrate (26) surface in said frame central opening (38), said connector housing assembly (40) including a plurality of contact members (42), each of said plurality of contact members having a first contact portion in contact with a respective one of said first substrate contact pads (28) and a second contact portion exposed through a planar surface of said connector housing assembly (40), said connector housing assembly (40) planar surface being parallel o said first substrate (26) surface and being spaced therefrom;

means (16, 18) for supporting said second substrate in said frame central opening above said connector housing assembly with said second substrate pads (14) in contact with respective ones of said exposed second contact portions of said plurality of contact members;

a lid member (44) hingedly mounted (46) to said frame (32) for movement between a closed position parallel to said first substrate (26) surface and an open position transverse to said first substrate surface;

means (64) mounted on said lid member (44) for applying a force to said second substrate (12) within said frame central opening (38) when said lid member (44) is in said closed position, said force being sufficient to establish electrical contact between said first substrate contact pads (28) and said second substrate contact pads (14) through said contact members (42);

means (58, 62) for locking said lid member (44) in said closed position; and means (68) for releasably retaining said second substrate (12) within said frame central opening (38) when said lid member (44) is in said open position, said lid member (44) being effective when in said closed position to release said second substrate (12) from said retaining means (68) and thereafter keep said second substrate (12) released as the lid member (44) is moved toward said open position.

11. The assembly according to claim 10 wherein said retaining means includes at least one spring finger (68) extending into the frame central opening (38) and adapted to be moved away from the frame central opening (38) as said second substrate (12) is placed therein and subsequently move back into the frame central opening (38) to interfere with the removal of said second substrate (12).

12. The assembly according to claim 10 further including ejection means (70, 72) mounted in said frame central opening (38) for moving said second substrate (12) out of said frame central opening (38) when said second substrate (12) is released from said retaining means (68) and said lid member (44) is moved toward said open position.

13. The assembly according to claim 12 wherein said ejection means includes spring means (70, 72) mounted in said frame central opening (38) below said second substrate (12) for exerting a force tending to move said second substrate (12) out of said frame central opening (38).

* * * * *

UNITED STATES PATENT OFFICE
CERTIFICATE OF CORRECTION

Patent No. 5,009,608                        Dated  April 23, 1991

Inventor(s)  Joanne Eileen Shipe

It is certified that error appears in the above-identified patent and that said Letters Patent is hereby corrected as shown below:

In the ABSTRACT, line 12, the word "Then" should be --The--.

In Claim 10, column 8, line 3, the letter "o" should be --to--.

Signed and Sealed this

First Day of September, 1992

Attest:

DOUGLAS B. COMER

Attesting Officer          Acting Commissioner of Patents and Trademarks